US007671001B2

(12) United States Patent  
Skee

(10) Patent No.: US 7,671,001 B2
(45) Date of Patent: Mar. 2, 2010

(54) ALKALINE, POST PLASMA ETCH/ASH RESIDUE REMOVERS AND PHOTORESIST STRIPPING COMPOSITIONS CONTAINING METAL-HALIDE CORROSION INHIBITORS

(75) Inventor: David C. Skee, Bethlehem, PA (US)

(73) Assignee: Mallinckrodt Baker, Inc., Phillipsburg, NJ (US)

( * ) Notice: Subject to any disclaimer, the term of this patent is extended or adjusted under 35 U.S.C. 154(b) by 940 days.

(21) Appl. No.: 10/572,860

(22) PCT Filed: Oct. 20, 2004

(86) PCT No.: PCT/US2004/034541

§ 371 (c)(1), (2), (4) Date: Mar. 22, 2006

(87) PCT Pub. No.: WO2005/043245

PCT Pub. Date: May 12, 2005

(65) Prior Publication Data

US 2007/0060490 A1 Mar. 15, 2007

Related U.S. Application Data

(60) Provisional application No. 60/515,234, filed on Oct. 29, 2003.

(51) Int. Cl.
H01L 21/02 (2006.01)
(52) U.S. Cl. .................................. 510/175; 134/1.3
(58) Field of Classification Search .................. 510/175; 134/1.3
See application file for complete search history.

(56) References Cited

U.S. PATENT DOCUMENTS

| | | | | |
|---|---|---|---|---|
| 3,923,962 | A | * | 12/1975 | Schaupp et al. ............. 423/339 |
| 4,239,661 | A | | 12/1980 | Muraoka |
| 4,374,920 | A | | 2/1983 | Wanat et al. |
| 4,628,023 | A | | 12/1986 | Cawston et al. |
| 4,704,212 | A | * | 11/1987 | Schindler et al. ............. 510/518 |
| 4,744,834 | A | | 5/1988 | Haq |
| 4,776,892 | A | | 10/1988 | Steppan et al. |
| 5,279,771 | A | | 1/1994 | Lee |
| 5,308,745 | A | | 5/1994 | Schwartzkopf |
| 5,334,332 | A | | 8/1994 | Lee |
| 5,381,807 | A | | 1/1995 | Lee |
| 5,412,868 | A | | 5/1995 | Nguyen et al. |
| 5,419,779 | A | | 5/1995 | Ward |
| 5,466,389 | A | | 11/1995 | Ilardi et al. |
| 5,482,566 | A | | 1/1996 | Lee |
| 5,498,293 | A | | 3/1996 | Ilardi et al. |
| 5,561,105 | A | | 10/1996 | Honda |
| 5,563,119 | A | | 10/1996 | Ward |
| 5,597,983 | A | | 1/1997 | Nguyen et al. |
| 5,709,756 | A | | 1/1998 | Ward et al. |
| 5,759,973 | A | | 6/1998 | Honda et al. |
| 5,817,610 | A | | 10/1998 | Honda et al. |
| 5,868,916 | A | * | 2/1999 | Moulton ..................... 204/541 |
| 5,897,716 | A | | 4/1999 | Reghi et al. |
| 5,907,947 | A | | 6/1999 | Reghi et al. |
| 6,020,292 | A | | 2/2000 | Honda et al. |
| 6,057,240 | A | | 5/2000 | Zhou et al. |
| 6,143,705 | A | | 11/2000 | Kakizawa et al. |
| 6,465,403 | B1 | | 10/2002 | Skee |
| 6,585,825 | B1 | | 7/2003 | Skee |
| 6,599,370 | B2 | | 7/2003 | Skee |
| 2003/0183247 | A1 | | 10/2003 | Kool et al. |

FOREIGN PATENT DOCUMENTS

| | | | |
|---|---|---|---|
| CN | 1802731 | | 7/2006 |
| DE | 3444055 A | * | 6/1986 |
| EP | 540261 | | 5/1993 |
| EP | 578507 | | 1/1994 |
| EP | 1211564 | | 6/2002 |
| JP | 1120552 | | 5/1989 |
| JP | 01243528 | | 9/1989 |
| JP | 6041773 | | 2/1994 |
| JP | 06216098 | | 8/1994 |
| JP | 06250400 | | 9/1994 |
| JP | 9319098 | | 12/1997 |
| SU | 1641773 A | * | 4/1991 |
| WO | WO 91/17484 | | 11/1991 |
| WO | WO 97/05228 | | 2/1997 |
| WO | WO 98/00244 | | 1/1998 |
| WO | WO 99/60448 | | 11/1999 |
| WO | WO 2004/100245 | | 11/2004 |

OTHER PUBLICATIONS

Dejule, Managing Etch and Implant Residue, *Semiconductor International*, Aug. 1997, vol. 20 (9), pp. 56-58, 60, 62, 64.
Pai et al., Metal Corrosion in Wet Resist-Stripping Process, Proc. Interface 1989, pp. 137-148.
Ambat et al., Influence of pH on the corrosion of medium strength aerospace alloys 8090, 2091 and 2014, Corrosion Science, 1992, vol. 33 (5), pp. 681-690.

* cited by examiner

Primary Examiner—Gregory E Webb
(74) Attorney, Agent, or Firm—George W. Rauchfuss, Jr.; Ohlandt, Greeley, Ruggiero & Perle

(57) ABSTRACT

The invention provides alkaline compositions useful in the microelectronics industry for stripping or cleaning semiconductor wafer substrates by removing photoresist residues and other unwanted contaminants. The compositions contain (a) one or more bases and (b) one or more metal corrosion inhibiting metal halides of the formula: $W_zMX_y$ where M is a metal selected from the group Si, Ge, Sn, Pt, P, B, Au, Ir, Os, Cr, Ti, Zr, Rh, Ru, and Sb; X is a halide selected from F, Cl, Br and I; W is selected from H, to an alkali or alkaline earth metal, and a metal ion-free hydroxide base moiety; y is a numeral of from 4 to 6 depending on the metal halide; and z is a numeral of 1, 2 or 3.

20 Claims, No Drawings

ALKALINE, POST PLASMA ETCH/ASH RESIDUE REMOVERS AND PHOTORESIST STRIPPING COMPOSITIONS CONTAINING METAL-HALIDE CORROSION INHIBITORS

CROSS REFERENCE TO RELATED APPLICATIONS

This application is a national stage application of PCT/US2004/034541, filed Oct. 20, 2004, which claims the benefit of U.S. Provisional Application No. 60/515,234 filed Oct. 29, 2003.

FIELD OF THE INVENTION

This invention relates to compositions useful in the microelectronics industry for cleaning semiconductor wafer substrates. Particularly, this invention relates to alkaline stripping or cleaning compositions containing metal-halide corrosion inhibitors that are used for cleaning wafers having metal lines and vias by removing post plasma etch and ash residue and metallic and organic contamination with reduced metal corrosion and without any significant damaging of the integrated circuits. The compositions are also suitable for stripping photoresist from the wafer substrates. The invention also relates to the use of the compositions for removing post plasma etch and ash residue and metallic and organic contamination with reduced metal corrosion and without any significant damaging of the integrated circuits and to stripping photoresist from the wafer substrates.

DESCRIPTION OF THE PRIOR ART

An integral part of microelectronic fabrication is the use of photoresists to transfer an image from a mask or reticle to the desired circuit layer. After the desired image transfer has been achieved, an etching process is used to form the desired structures. The most common structures formed in this way are metal lines and vias.

The metal lines are used to form electrical connections between various parts of the integrated circuit that lie in the same fabrication layer. The vias are holes that are etched through dielectric layers and later filled with a conductive metal. These are used to make electrical connections between different vertical layers of the integrated circuit. A halogen containing gas is generally used in the processes used for forming metal lines and vias.

After the etching process has been completed, the bulk of the photoresist may be removed by either a chemical stripper solution or by an oxygen plasma ashing process. The problem is that these etching processes produce highly insoluble metal-containing residues that may not be removed by common chemical stripper solutions. Also, during an ashing process the metal-containing residues are oxidized and made even more difficult to remove, particularly in the case of aluminum-based integrated circuits. See, "Managing Etch and Implant Residue," *Semiconductor International*, August 1997, pages 56-63.

An example of such an etching process is the patterning of metal lines on an integrated circuit. In this process, a photoresist coating is applied over a metal film then imaged through a mask or reticle to selectively expose a pattern in the photoresist coating. The coating is developed to remove either exposed or unexposed photoresist, depending on the tone of the photoresist used, and produce a photoresist pattern on the metal. The remaining photoresist is usually hard-baked at high temperature to remove solvents and optionally to cross-link the polymer matrix. The actual metal etching step is then performed. This etching step removes metal not covered by photoresist through the action of a gaseous plasma. Removal of such metal transfers the pattern from the photoresist layer to the metal layer. The remaining photoresist is then removed ("stripped") with an organic stripper solution or with an oxygen plasma ashing procedure. The ashing procedure is often followed by a rinsing step that uses a liquid organic stripper solution. However, the stripper solutions currently available, usually alkaline stripper solutions, leave insoluble metal oxides and other metal-containing residues on the integrated circuit.

Another example of such an etching process is the patterning of vias (interconnect holes) on an integrated circuit. In this process, a photoresist coating is applied over a dielectric film then imaged through a mask or reticle to selectively expose a pattern in the photoresist coating. The coating is developed to remove either exposed or unexposed photoresist, depending on the tone of the photoresist used, and produce a photoresist pattern on the metal. The remaining photoresist is usually hard-baked at high temperature to remove solvents and optionally to cross-link the polymer matrix. The actual dielectric etching step is then performed. This etching step removes dielectric not covered by photoresist through the action of a gaseous plasma. Removal of such dielectric transfers the pattern from the photoresist layer to the dielectric layer. The remaining photoresist is then removed ("stripped") with an organic stripper solution or with an oxygen plasma ashing procedure. Typically, the dielectric is etched to a point where the underlying metal layer is exposed. A titanium or titanium nitride anti-reflective or diffusion barrier layer is typically present at the metal/dielectric boundary. This boundary layer is usually etched through to expose the underlying metal. It has been found that the action of etching through the titanium or titanium nitride layer causes titanium to be incorporated into the etching residues formed inside of the via. Oxygen plasma ashing oxidizes these via residues making them more difficult to remove.

The use of alkaline strippers on microcircuit containing metal films has not always produced quality circuits, particularly when used with metal films containing aluminum or various combinations or alloys of active metals such as aluminum or titanium with more electropositive metals such as copper or tungsten. Various types of metal corrosion, such as corrosion whiskers, pitting, notching of metal lines, have been observed due, at least in part, to reaction of the metals with alkaline strippers. Further it has been shown, by Lee et al., Proc. Interface '89, pp. 137-149, that very little corrosive action takes place until the water rinsing step that is required to remove the organic stripper from the wafer. The corrosion is evidently a result of contacting the metals with the strongly alkaline aqueous solution that is present during rinsing. Aluminum metal is known to corrode rapidly under such conditions, Ambat et al., Corrosion Science, Vol. 33 (5), p. 684. 1992.

Prior methods used to avoid this corrosion problem employed intermediate rinses with non-alkaline organic solvents such as isopropyl alcohol. However, such methods are expensive and have unwanted safety, chemical hygiene, and environmental consequences.

The prior art discloses several organic strippers used to remove bulk photoresist after the etching process. U.S. Pat. Nos. 4,765,844, 5,102,777 and 5,308,745 disclose photoresist strippers comprising various combinations of organic solvents. These strippers, however, are not very effective on wafers that have been "ashed" with oxygen plasmas as described above. Some photoresist strippers attempt to address this problem by adding additional water and an organic corrosion inhibitor such as catechol. Such compositions are disclosed in U.S. Pat. Nos. 5,482,566, 5,279,771, 5,381,807, 5,334,332, 5,709,756, 5,707,947, and 5,419,779 and in WO 9800244. In some cases, the hydrazine derivative, hydroxylamine, is added as well. The use of catechol or hydroxylamine in stripping compositions gives rise to various environmental, safety, and health concerns.

The use of an aqueous solution containing a quaternary ammonium hydroxide and a quaternary ammonium salt of silicic acid or alkyl silicate has been used as photoresist developers for positive tone photoresists in disclosures such as JP 1120552 (published May 12, 1989) and U.S. Pat. No. 4,628,023. Positive tone photoresist developers are used to remove patterned bulk photoresist after exposure to a solublizing radiation source. Developers are used prior to etching for pattern transfer to the exposed metal or dielectric substrate where metallic residues are generated. The object of the use of a quaternary ammonium salt of silicic acid in this disclosure is to prevent corrosion of metal substrates while removing the soluble bulk organic photoresist and not the removal of metal-rich post etch residues present on metal substrates without causing corrosion.

In U.S. Pat. Nos. 6,599,370; 6,585,825; 6,465,403; 6,020,292; and 5,817,610 and EP 829,768 the use of a quaternary ammonium silicate, quaternary ammonium hydroxide and water is disclosed for use in removing plasma etch residues. In U.S. Pat. No. 5,759,973 and EP 828,197 the use of a quaternary ammonium silicate, an amine compound, water and optionally an organic polar solvent is disclosed for use as a stripping and cleaning composition. In WO 9960448, many silicate containing compositions are described that effectively remove metal-containing ash residues without causing corrosion.

The use of a quaternary ammonium hydroxide in photoresist strippers is disclosed in U.S. Pat. Nos. 4,776,892, 5,563,119, and 4,744,834, and in JP 09319098 A2; EP 578507 A2; WO 9117484 A1. The use of chelating and complexing agents to sequester metals in various cleaners has also been reported in WO 9705228, U.S. Pat. No. 5,466,389, U.S. Pat. No. 5,498,293, EP 812011, U.S. Pat. No. 5,561,105, JP 06216098, JP 0641773, JP 06250400 and GB 1,573,206.

The use of an alkyl ammonium hydroxide solution containing a surfactant capable of forming a monolayer absorbed onto the sidewall of a patterned metal layer is disclosed in U.S. Pat. No. 6,057,240 for use as a post etch residue remover used in the fabrication process of a microelectronic device.

Photoresist developers containing tetramethylammonium hydroxide have also been disclosed as being useful for removing post via etch polymers in U.S. Pat. No. 5,412,868 and U.S. Pat. No. 5,597,983 and EP 540261 B1.

U.S. Pat. No. 5,466,389 discloses an aqueous alkaline containing cleaning solution for microelectronics substrates that contains a quaternary ammonium hydroxide and optional metal chelating agents and is useful for a pH range of about 8 to 10.

U.S. Pat. No. 5,498,293 discloses a process for using an aqueous alkaline cleaning solution that contains a quaternary ammonium hydroxide and optional metal chelating agents useful for cleaning silicon wafers. The disclosure of this cleaning process is for treatments to substrates before the presence of integrated metal circuits and is used to generate a wafer surface that is essentially silicon dioxide free and would be employed before the use of photoresist for integrated circuit fabrication. The present invention, in contrast, focuses on the cleaning of wafers with integrated circuits present which have been photoresist coated, etched, and oxygen plasma ashed.

There is a further need for compositions that are able to more effectively clean plasma etch and/or ash residue from semiconductor wafers without causing significant corrosion of the exposed metal and damage to the dielectric features found on these semiconductor wafers.

SUMMARY OF THE INVENTION

It is, therefore, a feature of the present invention to provide compositions useful in the microelectronics industry for cleaning semiconductor wafer substrates. It is another feature of the present invention to provide compositions that remove metallic and organic contamination from semiconductor wafer substrates without damaging the integrated circuits. It is another feature of the present invention to provide compositions that are able to remove photoresist from the wafer substrates. It is a further feature of the present invention to provide a method for cleaning semiconductor wafer substrates that removes metallic and organic contamination from such substrates without damaging the integrated circuits and avoiding the expense and adverse consequences caused by intermediate rinses. These and other features are achieved using new alkaline compositions, generally aqueous, alkaline compositions, for stripping or cleaning semiconductor wafer substrates, which alkaline composition contains one or more metal halide corrosion inhibitors. The compositions are placed in contact with a semiconductor wafer substrate for a time and at a temperature sufficient to clean unwanted contaminants and/or residues from the substrate surface with reduced or eliminated metal corrosion and damage to dielectrics.

The alkaline compositions contain one or more bases, preferably metal ion-free bases, generally dissolved in water in sufficient amounts to produce an alkaline pH, and preferably a pH of about 9 or greater, more preferably of from pH about 9 to about 13, and a metal corrosion inhibiting effective amount, generally about 0.5% to about 10% by weight, of at least one metal-halide corrosion inhibiting compound comprising at least one metal halide corrosion inhibiting compound selected from metal halide compounds of the formula:

$$W_z MX_y$$

where M is a metal selected from the group Si, Ge, Sn, Pt, P, B, Au, Ir, Os, Cr, Ti, Zr, Rh, Ru and Sb, preferably Si, Ge, Zr and Sb; X is halide selected from F, Cl, Br and I, preferably F; W is selected from H, an alkali or alkaline earth metal or a metal-ion-free hydroxide base moiety, especially an ammonium or tetraalkyl($C_1$-$C_4$) ammonium group; y is a numeral of from 4 to 6 depending on the metal halide; and z is a numeral of 1, 2 or 3. Any suitable base may be used in the compositions of this invention. Preferably, the base is selected from hydroxides and organic amines, most preferably quaternary ammonium hydroxides, ammonium hydroxides and diamines. The compositions may, and preferably do, contain one or more other optional components, including but not limited to components such as for example, water, organic solvents and co-solvents, metal chelating or complexing agents, fluoride compounds, silicates, additional metal corrosion inhibitors, surfactants, titanium residue removal enhancing agents, bath stabilizing agents, and the like.

The method for cleaning semiconductor wafer substrates of the present invention requires that the compositions of the present invention be placed in contact with a semiconductor wafer substrate for a time and at a temperature sufficient to clean unwanted contaminants and/or residues from the substrate surface. The method includes both bath and spray applications. Typically, the substrate is exposed to the composition for the appropriate time and at the appropriate temperature, rinsed using high purity de-ionized water, and dried.

The compositions clean wafer substrates by removing metallic and organic contamination. Importantly, the cleaning process does not damage integrated circuits on the wafer substrates and avoids the expense and adverse consequences associated with intermediate rinses required in prior methods.

DETAILED DESCRIPTION OF THE INVENTION

The present invention provides new alkaline compositions for stripping or cleaning semiconductor wafer substrates that contain one or more bases, preferably a metal ion-free base dissolved in water, and one or more metal corrosion inhibiting metal halide compounds of the formula $$W_zMX_y$$

where M is a metal selected from the group Si, Ge, Sn, Pt, P, B, Au, Ir, Os, Cr, Ti, Zr, Rh, Ru and Sb, preferably Si, Ge, Zr and Sb; X is a halide selected from F, Cl, Br and I, preferably F; W is selected from H, an alkali or alkaline earth metal or a metal-ion-free hydroxide base moiety, especially an ammonium or tetraalkyl($C_1$-$C_4$) ammonium group; y is a numeral of from 4 to 6 depending on the metal halide; and z is a numeral of 1, 2 or 3. The compositions may, and preferably do, contain other optional components, including but not limited to components such as for example, water, organic solvents and co-solvents, metal chelating or complexing agents, fluoride compounds, silicates, additional metal corrosion inhibitors, surfactants, titanium residue removal enhancing agents, bath stabilizing agents, and the like.

Any suitable base may be used in the compositions of the present invention, generally in an amount of from about 0.1% to about 30%, preferably from about 0.15 to about 10%, and most preferably about 0.1% to about 5%, by weight based on the weight of the composition. The bases are preferably quaternary ammonium hydroxides, such as tetraalkyl ammonium hydroxides (including hydroxy- and alkoxy-containing alkyl groups generally of from 1 to 4 carbon atoms in the alkyl or alkoxy group) and diamines. The most preferable of these alkaline materials are tetramethyl ammonium hydroxide and trimethyl-2-hydroxyethyl ammonium hydroxide (choline). Examples of other usable quaternary ammonium hydroxides include: trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyidi(2-hydroxyethyl) ammonium hydroxide, monomethyltriethanol ammonium hydroxide, tetraethyl ammonium hydroxide, tetrapropyl ammonium hydroxide, tetrabutyl ammonium hydroxide, tetraethanol ammonium hydroxide, monomethyltriethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, and the like and mixtures thereof Other bases that will function in the present invention include ammonium hydroxide, organic amines particularly alkanolamines such as 2-aminoethanol, 1-amino-2-propanol, 1-amino-3-propanol, 2-(2-aminoethoxy)ethanol, 2-(2-aminoethylamino)ethanol, 2-(2-aminoethylamino)ethylamine and the like, and other strong organic bases such as guanidine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,12-dodecanediamine, 1,3-pentanediamine, 4-aminomethyl-1,8-octanediamine, aminoethylpiperazine, 4-(3-aminopropyl)morpholine, 1,2-diaminocyclohexane, tris(2-aminoethyl)amine, 2-methyl-1,5-pentanediamine and hydroxylamine. Alkaline solutions containing metal ions such as sodium or potassium may also be operative, but are not preferred because of the possible residual metal contamination that could occur. Mixtures of these additional alkaline components, particularly ammonium hydroxide, with the aforementioned tetraalkyl ammonium hydroxides are also useful.

The compositions of this invention contain one or more metal corrosion inhibiting metal halide compounds of the formula $$W_zMX_y$$

where M is a metal selected from the group Si, Ge, Sn, Pt, P, B, Au, Ir, Os, Cr, Ti, Zr, Rh, Ru and Sb, preferably Si, Ge, Zr and Sb; X is a halide selected from F, Cl, Br and I, preferably F; W is selected from H, an alkali or alkaline earth metal or a metal-ion-free hydroxide base moiety, especially an ammonium or tetraalkyl($C_1$-$C_4$) ammonium group; y is a numeral of from 4 to 6 depending on the metal halide; and z is a numeral of 1, 2 or 3. The metal halide corrosion inhibiting compounds can be, but is not limited to, compounds such as the following: $H_2SiF_6$, $H_2GeF_6$, $(NH_4)_2GeF_6$, $HSbF_6$, $HPF_6$, $LiSnF_6$, $H_2PtCl_6$, $H_2TiF_6$, $(NH_4)_2OsBr_6$, $(NH_4)_2PtBr_6$, $(NH_4)_2IrCl_6$, $(NH_4)_2IrCl_6$, $(NH_4)_2OsCl_6$, $(NH_4)_2PdCl_6$, $(NH_4)_3RhCl_6$, $(NH_4)_2RuCl_6$, $(NH_4)_2SnCl_6$, $(NH_4)PF_6$, $(NH_4)_2SiF_6$, $(NH_4)_2TiF_6$, $H_2IrBr_6$, $H_2OsBr_6$, $H_2PtBr_6$, $H_2IrBr_6$, $H_2IrCl_6$, $H_2PtCl_6$, $HAuBr_4$, $HAuCl_4$, $(CH_3)_4NPF_8$, $HBF_4$, $NH_4BF_4$, $H_2ZrF_6$, $H_2OsCl_6$, $(NH_4)_2ZrF_6$, $((CH_3)_4N)_2SiF_6$, $((CH_3)_4N)_2ZrF_6$, $((CH_3)_4N)_2GeF_6$, $(CH_3)_4NSbF_6$, $H_3CrF_6$, $(NH_4)_3CrF_6$, $H_2CrF_6$, $(NH_4)_2CrF_6$, and $(CH_3)_4NBF_4$. The preferred metal halide corrosion inhibitor is $H_2SiF_6$. The metal halide corrosion inhibiting compound will generally be present in the composition in an amount of from about 0.5% to about 10%, preferably from about 0.5% to about 6%, and more preferably from about 0.5% to about 5%, by weight of the total composition.

The composition is preferably an aqueous solution containing the base, the metal halide corrosion inhibitor compound, and water, preferably high purity de-ionized water, and the optional components, if any. The water may be present in the composition in an amount of from about 0% to about 99%, preferably from about 1% to about 99%, and more preferably from about 25% to about 98%, by weight of the composition.

The compositions of the present invention may also contain one or more suitable water-soluble organic solvents or co-solvents. The solvents and co-solvents may be present in the composition in an amount of from 0 to about 90%, preferably from about 0.1% to about 80%, and more preferably from about 1% to about 30%, by weight based on the total composition. Among the various organic solvents and co-solvents suitable are alcohols, polyhydroxy alcohols, glycols, glycol ethers, alkyl-pyrrolidinones such as N-methylpyrrolidinone (NMP), 1-hydroxyalkyl-2-pyrrolidinones such as 1-(2-hydroxyethyl)-2-pyrrolidinone (HEP), dimethylformamide (DMF), dimethylacetamide (DMAc), sulfolane, dimethyl-2-piperidone (DMPD) or dimethylsulfoxide (DMSO). These solvents may be added to reduce aluminum and/or aluminum-copper alloy and/or copper corrosion rates if further aluminum and/or aluminum-copper alloy and/or copper corrosion inhibition is desired. Preferred water-soluble organic solvents are polyhydroxy alcohols such as glycerol and/or 1-hydroxyalkyl-2-pyrrolidinones such as 1-(2-hydroxyethyl)-2-pyrrolidinone (HEP).

The compositions may also contain a water-soluble metal ion-free silicate. The silicate may be employed in the composition in an amount of from about 0 to about 5%, preferably from about 0.01% to 5%, by weight of the composition. and a metal chelating or complexing agent in a concentration by weight of about 0.01% to about 10%, generally from about 0.01% to about 2%, by weight of the composition.

Any suitable metal ion-free silicate may be used in the compositions of the present invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits.

The compositions of the present invention may also be formulated with suitable metal chelating or complexing agents to increase the capacity of the formulation to retain metals in solution and to enhance the dissolution of metallic residues on the wafer substrate. Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid, ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, 1,5,9-triazacyclododecane-N,N',N'''-tris(methylenephosphonic acid) (DOTRP), 1,4,7,10-tetraazacyclododecane-N,N',N'',N'''-tetrakis(methylenephosphonic acid) (DOTP), nitrilotris(methylene)triphosphonic acid, diethylenetriaminepenta(methylenephosphonic acid) (DETAP), aminotri(methylenephosphonic acid), 1-hydroxyethylene-1,1-diphosphonic acid, bis(hexamethylene)triamine phosphonic acid, 1,4,7-triazacyclononane-N,N',N''-tris(methylenephosphonic acid (NOTP), 2-phosphonobutane-1,2,4-tricarboxylic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, 5-sulfosalicylic acid, catechol, gallic acid, propyl gallate, pyrogallol, 8-hydroxyquinoline, and cysteine. Examples of complexing agents are phosphoric acid, nitric acid, sulfuric acid, hydrochloric acid and hydrofluoric acid. A phosphonic acid or CyDTA chelating agent is preferably employed when the composition contains an oxidizing bath stabilizing agent, such as hydrogen peroxide. Chelating agents such as EDTA are not nearly as oxidation resistant as CyDTA and phosphonic acid chelating agents.

Preferred chelating agents are aminocarboxylic acids such as EDTA or CyDTA and phosphonic acids. Many aminocarboxylic acids and phosphonic acid chelating agents have at least one pKa in the 10-13 range. Chelating agents of this class have a high affinity for the aluminum-containing residues typically found on metal lines and vias after plasma "ashing". In addition, the pka's for this class of chelating agents typically include one pKa of approximately 12 that improves the performance of the compositions of the invention.

The compositions of the present invention may also contain any suitable water-soluble amphoteric, non-ionic, cationic or anionic surfactant. The addition of a surfactant will reduce the surface tension of the formulation and improve the wetting of the surface to be cleaned and therefore improve the cleaning action of the composition. The surfactant may also be added to reduce aluminum corrosion rates if further aluminum corrosion inhibition is desired. The surfactant will generally be present in the composition in an amount of from about 0 to about 5%, preferably from about 0.1 to 3%, by weight of the composition.

Amphoteric surfactants useful in the compositions of the present invention include betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof.

Preferably, the amphoteric surfactants are cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics.

Non-ionic surfactants useful in the compositions of the present invention include acetylenic diols, ethoxylated acetylenic diols, fluorinated alkyl alkoxylates, fluorinated alkylesters, fluorinated polyoxyethylene alkanols, aliphatic acid esters of polyhydric alcohols, polyoxyethylene monoalkyl ethers, polyoxyethylene diols, siloxane type surfactants, and alkylene glycol monoalkyl ethers. Preferably, the non-ionic surfactants are acetylenic diols or ethoxylated acetylenic diols.

Anionic surfactants useful in the compositions of the present invention include carboxylates, N-acylsarcosinates, sulfonates, sulfates, and mono and diesters of orthophosphoric acid such as decyl phosphate. Preferably, the anionic surfactants are metal-free surfactants.

Cationic surfactants useful in the compositions of the present invention include amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants.

Examples of preferred surfactants include dimethyl hexynol (Surfynol-61), ethoxylated tetramethyl decynediol (Surfynol-465), polytetrafluoroethylene cetoxypropylbetaine (Zonyl FSK), Zonyl FSH and the like. These surfactants will generally be present in an amount of from 0 to about 5 wt %, preferably 0.1 to about 3 wt %, of the composition.

Any suitable bath stabilizing agent comprising of at least one pKa in the range of 10 to 13 may be used in the compositions of the present invention. The bath stabilizing agents are preferably compounds with at least one pKa in the range of 11 to 12.5. The most preferable of these compounds are acetone oxime, hydrogen peroxide, salicylic acid, 5-sulfosalicylic acid, phosphoric acid, 2-hydroxypyridine, 4-hydroxypyridine, resorcinol, 2-methylresorcinol, salicylaldoxime, 2-methyl-1,5-pentanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine, 1,12-dodecanediamine, 1,3-diaminopentane and orcinol. Other examples of bath stabilizing agents with a pKa in the preferred range of 11 to 12.5 are: hydrogen germanate, adenosine, cytosine, arginine, benzil-α-dioxime, benzimidazole, benzoylhydrazine, benzoylpyruvic acid, berberine, biguanide, 2-butyl-1-methyl-2-pyrroline, calmagite, chrome azurol S, chrome dark blue, cumene hydroperoxide, 1,2-cyclohexylenedinitriloacetic acid, cytidine, diethylbiguanide, diguanide, 2,4-dihydroxy-1-phenylazobenzene, 2,6-dihydroxypurine, dimethylbiguanide, ethylbiguanide, ethylenebiguanide, ethyl methyl ketoxime, 1-ethyl-2-methyl-2-pyrroline, 4-formyl-3-methoxypyridine, guanine, guanosine, 2-hydroxybenzaldehyde oxime, N-(hydroxyethyl)biguanide, 2-hydroxyquinoline, hypoxanthene, inosine, 5-iodohistamine, 2,2'-methylenebis (4-chlorophenol), 2-methyl-8-hydroxyquinoline, 4-methyl-8-hydroxyquinoline, 1-methylxanthine, phenylalanylarginine, silicic acid, sparteine, thorin, toluhydroquinone, tyrosylarginine, xanthosine, acetamidine, trifluoroethanol, trichloroethanol, pyridine-4-aldehyde, hypoxanthine, uric acid, pyrrolidine, diethylamine, piperidine, 3-amino-3-methylpentane, diisopropylamine, saccharin, 2,2,4-trimethylpiperidine, dibutylamine, L-3,4-dihydroxyphenylalanine, 2,2,6,6-tetramethylpiperidine, 5-hydroxytryptamine, butylcyclohexylamine, 2-phenylbenzimidazole, 2-methyl-2-butanethiol, 2-methyl-2-propanethiol, dihexylamine, methoxypyridine, 1,4-dihydroxy-2,3,5,6-tetramethylbenzene, glutarimide, malanonitrile, benzamidine, 4-hydroxyquinoline, 4,4,9,9-tetramethyl-5,8-diazododecane-2,11-diamine, 1,6-hexanediamine, 1,7-heptanediamine, 1,8-octanediamine, 1,9-nonanediamine 1,10-decanediamine, 1,12-dodecanediamine, hydrogen hyponitrite, hydroxylamine-N,N-disulfonic acid, (1,2-cyclohexylenedinitrilo)tetraacetic acid (CyDTA) and diethylenetriaminepenta(methylenephosphonic acid) (DETPA).

Additional examples of bath stabilizing agents with at least one pKa in the 10-11 range are: lysine, tyrosine, 3-amino-N,N-bis(2-aminoethyl)propylamine, tris(2-aminoethyl)amine, 3-(cyclohexylamino)-1-propanesulfonic acid, methylamine, dimethylamine, ethylamine, cysteamine, 1,2-ethanediamine, α-alanine, β-alanine, azetidine, methylglycine, cysteine, propylamine, 1,3-propanediamine, 4-aminobutanoic acid, 2-methylalanine, homocysteine, 2,4-diaminobutanoic acid, butylamine, 1,4-butanediamine, 2,3-butanediamine, 1,2-dimethylaminoethane, proline, N-methylpyrrolidine, 5-aminopentanoic acid, N-propylglycine, ornithine, 1-amino-2,2-dimethylpropane, diethylmethylamine, 3-methyl-1-butanamine, 2-methyl-2-butanamine, 3-pentanamine, pentylamine, 1,5-pentanediamine, 2-pyridinecarboxaldehyde oxime, hydroquinone, pipecolic acid, cyclohexylamine, 1,2-dimethylpyrrolidine, 1-methylpiperidine, 6-aminohexanoic acid, hexylamine, triethylamine, cresol, 2-dimethylaminopurine, 1,2-dimethylpiperidine, 1-ethylpiperidine, 2-heptanamine, heptylamine, tyramine, dopamine, N-methyl-2-heptanamine, octylamine, 1-butylpiperidine, nonylamine, tryptamine, d-ephedrine, bornylamine, neobornylamine, decylamine, undecylamine, dodecylamine, tridecylamine, tetradecylamine, L-thyroxine, pentadecylamine, hexadecylamine, octadecylamine, 4-aminobutyric acid, 2-amino-2-methylpropionic acid, 3-aminopropionic acid, ethylenediaminetetraacetic acid (EDTA), N,N'-dimethylethyleneamine-N,N'-diacetic acid, methylaminodiacetic acid, 2-methyl-2-propylamine, nitrilotriacetic acid, 1,2,4-triazole, chloral, ethtyl acetoacetate, phenol, β-phenylethylboric acid, nitromethane, thioglycollic acid, ethyl mercaptan, cyanamide, docosylamine, tert-butylamine, trimethylamine, 2-mercaptoethylamine, 5-aminovaleric acid, 4-aminophenol, hydrogen hypoiodite, aminopropylmorpholine, ethanethiol, carbonic acid, tetramethylammonium carbonate, ammonium bicarbonate, ammonium carbonate, choline bicarbonate, carbon dioxide+water, threonine, hydrogen thiophosphate, sarcosine, 4-methoxyphenol, 4-ethoxyphenol, 4-propoxyphenol, 4-butoxyphenol and 4-pentoxyphenol.

Additional examples of bath stabilizing agents with at least one pKa in the 12.5-13 range are: 5-hydroxymethylcytosine, oxaloacetic acid, cumene hydroperoxide, diguanidine, hydrogen sulfide and hydrogen peroxophosphate.

Additional suitable bath stabilizing agents having at least one pKa value of from 10 to 13 can be found listed in "Lange's Handbook of Chemistry", 15$^{th}$ Edition, Section 8, pages 8-24 to 8-79, by J. Dean, "The Determination of Ionization Constants, A Laboratory Manual" by A. Albert and E. Serjeant, 2nd edition, Chapters 6 to 9, pages 72-107, and the "CRC Handbook of Chemistry and Physics", 78$^{th}$ Edition, pages 7-1 to 7-3, 7-6 and 8-43 to 8-55, by D. Lide. Additional compounds with at least one pKa in the 10-13 range can also be found in the computer software programs "NIST Standard Reference Database 46: NIST Critically Selected Stability Constants of metal Complexes Database" available from NIST and the program "ACD/pKa DB" that is available from Advanced Chemistry Development, Inc. of Toronto, Canada. ACD/pKa DB also allows predictions of pka's from structures. The compounds having at least one pKa in the range of 10-13 useful as bath stabilization agents for this invention are those that when incorporated into a composition for stripping or cleaning integrated circuit substrates provide compositions that evidence less pH drop on aging of the composition compared to an identical composition without the bath stabilization agent. Mixtures of suitable bath stabilizing agents may be used.

The bath stabilizing agent may generally be employed in a the composition in an amount of from about 0% to about 50%, preferably from about 0.1% to about 35%, by weight of the composition.

The compositions of this invention may also contain other metal corrosion inhibitors, such as for example, benzotriazole, substituted benzotriazoles such as 5-methylbenzotriazole, pyrocatechol, 3,4-dihydroxybenzoic acid, 4-tert-butylcatechol, aromatic esters such as alkyl 3,4-dihydroxybenzoates, alkyl-2,4-dihydroxybenzoates, alkyl 3,5-dihydroxybenzoates, alkyl 2,6-dhfydroxybenzoates and alkyl 2,5-dihydroxybenzoates, alkyl gallates such as methylgallate, ethylgallate, propylgallate and butylgallate, pyrogallol, and gallic acid, may be employed in an amount of from 0 to about 5 wt %, preferably from about 0.1 to 2 wt %.

The cleaning compositions may also optionally contain fluoride compounds in cleaning composition, such as for example, tetramethylammonium fluoride, tetrabutylammonium fluoride, and ammonium fluoride. Other suitable fluorides include, for example fluoroborates, tetrabutylammonium fluoroborates, aluminum hexafluorides, antimony fluoride and the like. The fluoride components will be present in an amount of from 0 to 10%, preferably from about 0.1% to 5%, by weight of the composition.

The compositions of this invention may also optionally contain one or more titanium residue removal enhancers, such as for example, tetraalkylammonium fluoride, ammonium fluoride, HF, peroxide such as hydrogen peroxide ($H_2O_2$), ozone, and hydroxylamine. The titanium residue removal enhancers may be employed in the compositions in an amount of from about 0 to about 30%, preferably from about 0.1% to about 20%, and most preferably about 1% to about 18%, by weight of the composition.

The cleaning compositions of this invention also optionally contain an oxidizing agent to provide further protection against metal, especially aluminum, corrosion. Any suitable oxidizing agent, including, but not limited to, hydrogen peroxide, persulfates, perphosphates, hyposulfites, hypochlorites and the like may be employed in the cleaning compositions of this invention. The preferred oxidizing agents are hydrogen peroxide and hypochlorite. The amount of oxidizing agent employed will generally be in an amount of from 0% up to about 9%, preferably from about 0.25% to about 8%, more preferably from about 0.5% to 3%, and most preferably from about 0.6% to about 1.6%, by weight of the composition.

The method of the present invention cleans semiconductor wafer substrates by exposing the contaminated substrate to the compositions of the present invention for a time and at a temperature sufficient to clean unwanted contaminants from the substrate surface. Optionally, the substrate is rinsed to remove the composition and the contaminants and dried to remove any excess solvents or rinsing agents. The substrate can then be used for its intended purpose.

Preferably, the method uses a bath or spray application to expose the substrate to the composition. Bath or spray cleaning times are generally 1 minute to 30 minutes, preferably 5 minutes to 20 minutes. Bath or spray cleaning temperatures are generally 10° C. to 85° C., preferably 20° C. to 65° C.

If required, the rinse times are generally 10 seconds to 5 minutes at room temperature, preferably 30 seconds to 2 minutes at room temperature. Preferably de-ionized water is used to rinse the substrates.

If required, drying the substrate can be accomplished using any combination of air-evaporation, heat, spinning, or pressurized gas. The preferred drying technique is spinning under a filtered inert gas flow, such as nitrogen, for a period of time until the wafer substrate is dry.

The method of the present invention is very effective for cleaning semiconductor wafer substrates that have been previously oxygen plasma ashed to remove bulk photoresist, particularly wafer substrates containing a silicon, silicon oxide, silicon nitride, tungsten, tungsten alloy, titanium, titanium alloy, tantalum, tantalum alloy, copper, copper alloy, aluminum or aluminum alloy film. The method removes unwanted metallic and organic contaminants but does not cause unacceptable corrosion to the silicon, silicon oxide, silicon nitride, tungsten, tungsten alloy, titanium, titanium alloy, tantalum, tantalum alloy, copper, copper alloy, aluminum or aluminum alloy film.

The following examples illustrate the specific embodiment of the invention described in this document. As would be apparent to skilled artisans, various changes and modifications are possible and are contemplated within the scope of the invention described.

EXAMPLES

The test procedures for the examples were as follows.

Aluminum Metal Etch-Rate Determination: Strips of Aluminum foil (99.8% pure, 0.05 mm thickness, purchased from Sigma-Aldrich, Inc.) was cut into strips 50 mm×13 mm then cleaned as follows: rinsed with de-ionized water, isopropyl alcohol and then acetone followed by drying in an oven. An initial weight was recorded using a 5-decimal precision analytical balance. The foil was then added to the apparatus comprising a Teflon capped 100 ml Teflon PFA bottle filled with the test solution and equipped with a Teflon stir bar, with the cap having a hole for a Teflon temperature probe. The bottle is set upon a digital hot plate stirrer. The aluminum foil was placed ion the solution in the bottle for 60 minutes at 45° C. with a Teflon-coated magnetic stir-bar stirring at a rate of 150 rpm. After the treatment was completed, the foil was removed, rinsed with de-ionized water, isopropyl alcohol and then acetone followed by drying in an oven. The final weight was recorded using the precision analytical balance. The weight loss in grams was used to calculate the metal etch-rate in Angstroms per minute using the following equation: $\{[[(\text{grams wt. loss})/(\text{grams starting wt.})]*(\text{mm foil thickness}/2)]/60 \text{ min.}\}*(1\times10^7 \text{ Angstroms/mm})=$Etch Rate in Angstroms per minute.

Titanium Metal Etch-Rate Determination: Titanium foil (99.94% pure, 0.025 mm thickness, purchased from Alfa Aesar, Inc.) was cut into strips 30 mm×25 mm and then bent in half to a 90 degree angle. The foil was then cleaned as follows: rinsed with de-ionized water, isopropyl alcohol and then acetone followed by drying in an oven. An initial weight was recorded using a 5-decimal precision analytical balance. A 125 ml polyethylene wide-mouth bottle containing the solution to be tested was pre-heated to 45° C. in an oven for approximately one hour prior to adding the foil. The foil was added so that the foil stood on edge and the cap loosely fitted on the bottle for 24 hours (1,440 min.) at 45° C. in the oven. Solutions were not agitated during the treatment time. After the treatment was completed, the foil was removed, rinsed with de-ionized water, isopropyl alcohol and then acetone followed by drying in an oven. The final weight was recorded using the precision analytical balance. The weight loss in grams was used to calculate the metal etch-rate in Angstroms per minute using the following equation: $\{[[(\text{grams wt. loss})/(\text{grams starting wt.})]*(\text{mm foil thickness}/2)]/1,440 \text{ min.}\}*(1\times10^7 \text{ Angstroms/mm})=$Etch Rate in Angstroms per minute.

FE-SEM Examples: Wafer samples with one micron wide features and aluminum-copper raised lines capped with titanium-nitride that had been previously prepared as follows: (a) metallization with aluminum-copper alloy followed by titanium nitride (b) lithographic patterning using a photoresist material (c) pattern transfer using reactive ion etching (d) oxygen plasma ashing to remove organic photoresist residues, but leaving mainly inorganic residues behind were used to evaluate the performance of the solutions. A wafer sample was placed in the solution at 45° C. for 20 minutes, removed, rinsed with de-ionized water and dried with pressurized nitrogen gas. After drying, the sample was inspected on a Field Emission Scanning Electron Microscope (FE-SEM) to determine the extent of cleaning and/or corrosion of the aluminum-copper metal features.

The amount of aluminum or aluminum-copper alloy metal corrosion is expressed as both percent metal loss and as a general corrosion remark. The general corrosion remarks given are very slight, slight, light, moderate and severe. A small amount of aluminum corrosion considered to be within acceptable limits were assigned very slight or slight. Light, moderate or severe corrosion were considered to be unacceptable. All cleaning and corrosion data entries generated using the Field Emission Scanning Electron Microscope (FE-SEM) was based on a visual interpretation of differences between untreated and treated samples from the same wafer. The reduction in aluminum and aluminum-copper alloy corrosion rate with the use of the inhibitors of this invention is demonstrated in Examples 1 and 3. The reduction in titanium corrosion rate with the use of the inhibitors of this invention is demonstrated in Example 2.

Formulations Employed in Examples

Aqueous solution "A1" was prepared with 5.35 weight percent tetramethylammonium hydroxide (TMAH), 0.11 weight percent trans-(1,2-cyclohexylenedinitrilo)tetraacetic acid (CyDTA) and 1.64 weight percent of hydrogen peroxide added with the remainder of this solution being de-ionized water and has a pH of about 13.3. Aqueous solution "A2" was prepared with 2.05 weight percent tetramethylammonium hydroxide (TMAH), 0.11 weight percent trans-(1,2-cyclohexylenedinitrilo)tetraacetic acid (CyDTA) and 1.64 weight percent of hydrogen peroxide added with the remainder of this solution being de-ionized water and has a pH of about 11.4. Aqueous solution "B1" was prepared with 3.35 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 0.23 weight percent of dihydrogen hexafluorosilicate (a product of Alfa Aesar, Inc.) added with the remainder of this solution being de-ionized water and has a pH of about 11.5. Aqueous solution "B2" was prepared with 4.83 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 0.46 weight percent of dihydrogen hexafluorosilicate (a product of Alfa Aesar, Inc.) added with the remainder of this solution being de-ionized water and has a pH of about 11.5. Aqueous solution "B3" was prepared with 5.04 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 0.60 weight percent of dihydrogen hexafluorosilicate (a product of Alfa Aesar, Inc.) added with the remainder of this solution being de-ionized water and has a pH of about 11.5. Aqueous solution "B4" was prepared with 5.35 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 0.69 weight percent of dihydrogen hexafluorosilicate (a product of Alfa Aesar, Inc.) added with the remainder of this solution being de-ionized water and has a pH of about 11.5. Aqueous solution "B5" was prepared with 9.61 weight percent tetramethylammonium hydroxide (TMAH), 0.11 weight percent trans-(1,2-cyclohexylenedinitrilo)tetraacetic acid (CyDTA), 1.64 weight percent of hydrogen peroxide, 0.69 weight percent of dihydrogen hexafluorosilicate (a product of Alfa Aesar, Inc.) and 2.04 weight percent ammonium fluoride added with the remainder of this solution being de-ionized water and has a pH of about 11.5. Aqueous solution "C1" was prepared with 4.09 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 1.00 weight percent of dihydrogen hexafluorogermanate added with the remainder of this solution being de-ionized water and has a pH of about 11.5. Aqueous solution "C2" was prepared with 6.24 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 3.75 weight percent of ammonium hexafluorogermanate (99.99%, a product of Alfa Aesar, Inc.) added with the remainder of this solution being de-ionized water and has a pH of about 11.5. Aqueous solution "D1" was prepared with 3.80 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 0.65 weight percent of hydrogen hexafluoroantimonate (V) (a product of Alfa Aesar, Inc.) added with the remainder of this solution being de-ionized water and has a pH of about 11.6. Aqueous solution "D2" was prepared with 8.73 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 2.58 weight percent of hydrogen hexafluoroantimonate (V) (a product of Alfa Aesar, Inc.) added with the remainder of this solution being de-ionized water and has a pH of about 11.6. Aqueous solution "E1" was prepared with 4.50 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 0.75 weight percent of dihydrogen hexafluorozirconate (a product of Sigma-Aldrich, Inc.) added with the remainder of this solution being de-ionized water and has a pH of about 11.5. Aqueous solution "E2" was prepared with 6.38 weight percent tetramethylammonium hydroxide (TMAH), 0.11 weight percent trans-(1,2-cyclohexylenedinitrilo)tetraacetic acid (CyDTA), 1.64 weight percent of hydrogen peroxide and 1.51 weight percent of dihydrogen hexafluorozirconate (a product of Sigma-Aldrich, Inc.) added with the remainder of this solution being de-ionized water and has a pH of about 11.5. Aqueous solution "F1" was prepared with 3.17 weight percent tetramethylammonium hydroxide (TMAH), 0.11 weight percent trans-(1,2-cyclohexylenedinitrilo)tetraacetic acid (CyDTA), 1.61 weight percent of hydrogen peroxide and 0.67 weight percent of tetrafluoroboric acid (a product of Sigma-Aldrich, Inc.) added with the remainder of this solution being de-ionized water and has a pH of about 11.6.

The dihydrogen hexafluorogermanate employed in the formulation C1 and C2 was prepared in the following manner. An aqueous, 21.0 weight percent solution of dihydrogen hexafluorogermanate solution was prepared by combining the following in a Teflon 125 ml bottle (there was some heat generation on mixing): 50.00 grams de-ionized water, 9.51 grams germanium dioxide (99.999% Puratronic Grade, a product of Alfa Aesar, Inc.) and 22.23 grams of 49.1% hydrofluoric acid (Finyte® Grade, a product of Mallinckrodt Baker, Inc.).

Example 1

TABLE 1

Aluminum Metal Foil Etch-Rate Comparisons
(Average values of etch rates given)

| Solution | pH | Al Corrosion Inhibitor | Conc. of Inhibitor (wt. %) | Conc. of Inhibitor as Anion (wt. %) | Aluminum Metal Etch-Rate (Å/min.) |
|---|---|---|---|---|---|
| A1 (B4 minus inhibitor) | 13.3 | None | 0 | 0 | >4,170 |
| A2 (B4 minus inhibitor with pH adjusted down) | 11.4 | None | 0 | 0 | >4,170 |

TABLE 1-continued

Aluminum Metal Foil Etch-Rate Comparisons
(Average values of etch rates given)

| Solution | pH | Al Corrosion Inhibitor | Conc. of Inhibitor (wt. %) | Conc. of Inhibitor as Anion (wt. %) | Aluminum Metal Etch-Rate (Å/min.) |
|---|---|---|---|---|---|
| B1 | 11.5 | $H_2SiF_6$ | 0.23 | 0.23 | 4,110 |
| B2 | 11.5 | $H_2SiF_6$ | 0.46 | 0.45 | >4,170 |
| B3 | 11.5 | $H_2SiF_6$ | 0.60 | 0.59 | 31.7 |
| B4 | 11.5 | $H_2SiF_6$ | 0.69 | 0.68 | 25.0 |
| B5 (B4 with 2.04% $NH_4F$ added and pH adjusted) | 11.5 | $H_2SiF_6$ | 0.69 | 0.68 | 2.2 |
| C1 | 11.5 | $H_2GeF_6$ | 1.00 | 0.99 | 67.6 |
| C2 | 11.5 | $(NH_4)_2GeF_6$ | 3.75 | 3.14 | 611 |
| D1 | 11.6 | $HSbF_6$ | 0.65 | 0.65 | 3,950 |
| D2 | 11.6 | $HSbF_6$ | 2.58 | 2.56 | 2,895 |

Example 2

| Solution | pH | Ti Corrosion Inhibitor | Conc. of Inhibitor (wt. %) | Conc. of Inhibitor as Anion (wt. %) | Titanium Metal Etch-Rate (Å/min.) |
|---|---|---|---|---|---|
| A3 (A2 at slightly greater pH) | 11.5 | none | 0 | 0 | 9.8 |
| B4 | 11.5 | $H_2SiF_6$ | 0.69 | 0.68 | 5.4 |
| D1 | 11.6 | $HSbF_6$ | 0.65 | 0.65 | 7.4 |
| E1 | 11.5 | $H_2ZrF_6$ | 0.75 | 0.74 | 0.4 |
| E2 | 11.5 | $H_2ZrF_6$ | 1.51 | 1.50 | 0.2 |
| F1 | 11.6 | $HBF_4$ | 0.67 | 0.66 | 5.9 |

Example 3

TABLE 2

FE-SEM Evaluation Results

| Solution | pH | Al Corrosion Inhibitor | Conc. of Inhibitor (wt. %) | Conc. of Inhibitor as Anion (wt. %) | Post-Ash Residue Removed (%) | Aluminum Metal Corrosion (% Metal Loss) |
|---|---|---|---|---|---|---|
| A1 (B4 minus inhibitor) | 13.3 | none | 0 | 0 | 100 | 100 (severe) |
| B3 | 11.5 | $H_2SiF_6$ | 0.60 | 0.59 | 100 | 4 (slight) |
| B4 | 11.5 | $H_2SiF_6$ | 0.69 | 0.68 | 96 | 0 |

The invention has been described and illustrated with various illustrative embodiments thereof. It will be appreciated that these embodiments are not limiting and that various modifications and changes may be made without departing from the spirit and scope of the invention.

I claim:

1. An alkaline composition having a pH of 9 or greater for stripping or cleaning integrated circuit substrates, comprising:

(a) one or more bases; and
(b) 0.05% to 10% by weight of one or more metal halide compounds of the formula:

$$W_zMX_y$$

where M is a metal selected from the group consisting of Si, Ge, Sn, Pt, P, B, Au, Ir, Os, Cr, Ti, Zr, Rh, Ru, and Sb; X is a halide selected from the group consisting of F, Cl, Br and I; W is selected from the group consisting of H, an alkali or alkaline earth metal, and a metal ion-free hydroxide base moiety; y is a numeral of from 4 to 6 depending on the metal halide; and z is a numeral of from 1, 2 or 3.

2. A composition according to claim 1 wherein the composition is an aqueous, alkaline composition, the base component (a) is a metal ion-free bases and the base is present in the composition in an amount sufficient to produce a pH of the composition of from about 10 to about 13.

3. The composition of claim 1 wherein the base component (a) is selected from the group consisting of ammonium hydroxide, quaternary ammonium hydroxides and diamines.

4. The composition of claim 3 wherein the base component (a) is a tetraalkyl ammonium hydroxide containing alkyl groups of from 1 to 4 carbon atoms.

5. The composition of claim 2 wherein M is selected from the group consisting of Si, Ge, Zr and Sb.

6. The composition of claim 5 wherein the metal halide is selected from the group consisting of $H_2SiF_6$, $H_2GeF_6$, $((CH_3)_4N)_2GeF_6$, $((CH_3)_4N)_2SiF_6$, $(NH_4)_2SiF_6$ and $(NH_4)_2GeF_6$.

7. The composition of claim 6 wherein the metal halide is $H_2SiF_6$.

8. The composition of claim 2 additionally comprising one or more additional components selected from the group consisting of organic solvents and co-solvents, metal chelating or complexing agents, silicates, fluorides, additional metal corrosion inhibitors, surfactants, titanium residue removal enhancing agents, oxidizing agents and bath stabilizing agents.

9. A composition of claim 2 comprising tetramethylammonium hydroxide, trans-(1,2-cyclohexylenedinitrilo)tetraacetic acid, hydrogen peroxide, water, and a metal halide compound selected from the group consisting of dihydrogen hexafluorosilicate, dihydrogenhexafluorogermanate and ammonium hexafluorogermanate.

10. A composition according to claim 9 having a pH of about 11.5.

11. A method for cleaning semiconductor wafer substrates, comprising:

contacting a semiconductor wafer substrate having a substrate surface for a time and at a temperature sufficient to clean unwanted contaminants and residues from said substrate surface with an alkaline composition having a pH of 9 or greater and comprising:

(a) one or more bases; and (b) 0.5% to 10% by weight of the composition of one or more metal halide compounds of the formula:

$$W_zMX_y$$

where M is a metal selected from the group consisting of Si, Ge, Sn, Pt, P, B, Au, Ir, Os, Cr, Ti, Zr, Rh, Ru, and Sb; X is a halide selected from the group consisting of F, Cl, Br and I; W is selected from the group consisting of H, an alkali or alkaline earth metal, and a metal ion-free hydroxide base moiety; y is a numeral of from 4 to 6 depending on the metal halide; and z is a numeral of from 1, 2 or 3.

12. A method according to claim 11 wherein the composition is an aqueous, alkaline composition, the base component (a) is a metal ion-free bases and the base is present in the composition in an amount sufficient to produce a pH of the composition of from about 10 to about 13.

13. The method of claim 11 wherein the base component (a) is selected from the group consisting of ammonium hydroxide, quaternary ammonium hydroxides and diamines.

14. The method of claim 13 wherein the base component (a) is a tetraalkyl ammonium hydroxide containing alkyl groups of from 1 to 4 carbon atoms.

15. The method of claim 12 wherein M is selected from the group consisting of Si, Ge, Zr and Sb.

16. The method of claim 15 wherein the metal halide is selected from the group consisting of $H_2SiF_6$, $H_2GeF_6$, $((CH_3)_4N)_2GeF_6$, $((CH_3)_4N)_2SiF_6$, $(NH_4)_2SiF_6$ and $(NH_4)_2GeF_6$.

17. The method of claim 16 wherein the metal halide is $H_2SiF_6$.

18. The method of claim 12 wherein the composition additionally comprises one or more additional components selected from the group consisting of organic solvents and co-solvents, metal chelating or complexing agents, silicates, fluorides, additional metal corrosion inhibitors, surfactants, titanium residue removal enhancing agents, oxidizing agents and bath stabilizing agents.

19. The method of claim 11 comprising tetramethylammonium hydroxide, trans-(1,2-cyclohexylenedinitrilo)tetraacetic acid, hydrogen peroxide, water, and a metal halide compound selected from the group consisting of dihydrogen hexafluorosilicate, dihydrogenhexafluorogermanate, and ammonium hexafluorogermanate.

20. The composition of claim 19 wherein the method has a pH of about 11.5.

* * * * *